United States Patent [19]

Barbu

[11] Patent Number: 4,769,616
[45] Date of Patent: Sep. 6, 1988

[54] HIGH-FREQUENCY DIFFERENTIAL AMPLIFIER STAGE AND AMPLIFIER COMPRISING SUCH A DIFFERENTIAL AMPLIFIER STAGE

[75] Inventor: Stefan Barbu, Caen, France

[73] Assignee: U.S. Philips Corporation, New York, N.Y.

[21] Appl. No.: 945,416

[22] Filed: Dec. 22, 1986

[30] Foreign Application Priority Data

Dec. 31, 1985 [FR] France ............... 85 19481

[51] Int. Cl.$^4$ ............................................. H03F 3/45
[52] U.S. Cl. ................................... 330/252; 330/259
[58] Field of Search ............... 330/252, 257, 260, 261, 330/259

[56] References Cited

U.S. PATENT DOCUMENTS

3,660,773  5/1972  Free ................................ 330/261 X
4,418,321  11/1983 Böhme ............................... 330/252

Primary Examiner—James B. Mullins
Attorney, Agent, or Firm—Thomas A. Briody; David R. Treacy; Bernard Franzblau

[57] ABSTRACT

A high-frequency differential-amplifier stage. The collectors of the transistors ($T_1$, $T_2$) are connected to the emitters of two transistors ($T_3$, $T_4$) coupled to provide feedback between their collectors and their bases and which are biased by means of resistors ($R_1$, $R_2$). This input stage forms a resonant circuit. Two current sources ($R_{32}$, $T_{32}$, $R_{31}$, $T_{31}$) improve the operation of this stage in the saturated mode.

12 Claims, 4 Drawing Sheets

FIG.9

HIGH-FREQUENCY DIFFERENTIAL AMPLIFIER STAGE AND AMPLIFIER COMPRISING SUCH A DIFFERENTIAL AMPLIFIER STAGE

BACKGROUND OF THE INVENTION

This invention relates to a high-frequency differential amplifier stage comprising a first transistor and a second transistor whose emitters are coupled to each other and are connected to a first current source. The bases are connected to input terminals for receiving input signals and the collectors are connected to the emitters of a third and a fourth transistor, respectively. The third and fourth transistors have their collectors connected to power-supply terminals for connection to a supply-voltage source via a first and a second load resistor, respectively. The bases of the third transistor and the fourth transistor are connected to the collectors of the fourth and the third transistor, respectively. The invention also relates to a multi-stage amplifier comprising such a differential amplifier stage.

Such an amplifier stage is described in the U.S. Pat. No. 4,703,284. The amplifier stage forms the input stage of an amplifier which further comprises an output stage cascaded with the input stage. Further, the amplifier has a gain which can be made higher than unity for a maximum operating frequency of the amplifier, for example 1 GHz, which closely approximates the intrinsic cut-off frequency of the transistors used, while it has a high gain for frequencies situated in the central part of its operating frequency range. The input stage is a tuned amplifier which is capable of amplifying small signals and which has a substantial gain at frequencies situated in the central part of its operating frequency range, and which has a slightly higher maximum gain at frequencies situated in the upper part of its operating frequency range.

SUMMARY OF THE INVENTION

It is an object of the present invention to improve the operation of the input stage, enabling signals of a substantial level to be handled without any problems.

Applicant has found that in the saturated mode this input stage exhibits charge-storage effects in a specific part of the frequency band. As will be explained in the description, a result of these charge-storage effects is that in respnse to a sinusoidal input signal of a high level, an output signal is produced which exhibits a saturation plateau below the nominal saturation level to be expected normally. The level of this plateau decreases as the level of the input signal increases.

The present invention enables the saturation level to be raised, thus allowing the input stage to handle signals of a higher level before reaching a saturated mode, and the operation in the saturated mode to be regulated. The basic idea of this improvement is to modify the operation of the third transistor and the fourth transistor in the non-saturated mode.

According to the invention the differential amplifier stage is characterized in that the amplifier stage comprises a second current source connected to the junction point between the collector of the second transistor and the emitter of the fourth transistor, and a third current source connected to the junction point between the collector of the first transistor and the emitter of the third transistor. The currents of the third current source and the fourth current source are directed in such a way that they tend to increase the emitter currents of the fourth transistor and the third transistor respectively, and with the sum of their currents being smaller than the current of the first current source.

If the currents meet this requirement the stage will not function as an oscillator.

The ratio between the sum of the currents of the second current source and the third current source and the current of the first current source is suitably of the order of 0.2.

The invention also relates to a high-frequency amplifier comprising a plurality of cascaded differential stages, which is characterized in that said stages comprise an input stage in accordance with the invention which is coupled directly to a subsequent stage and in that the product of the current of the second current source or the third current source and the resistance of the first bias resistor or the second bias resistor is smaller than the linear input range of the subsequent stage so as to prevent the latter stage from oscillating.

The subsequent stage may be of a logic type, for example a bistable multivibrator circuit, known per se, or a linear stage, for example an output stage in conformity U.S. Pat. No. 4,703,284.

If the subsequent stage is the above-mentioned output stage, the collectors of a fifth transistor and a sixth transistor in the subsequent stage may each be connected to the base of an output transistor arranged as an emitter-follower.

In order to limit the gain for d.c. components of the input signals, the amplifier may comprise a resistive divider bridge which is arranged between the collector of the fifth transistor and ground and whose tapping point, which is decoupled by means of a capacitor, is connected to the base of the first transistor by a first input resistor. A resistive divider bridge is arranged between the collector of the sixth transistor and ground and has a tapping point, which is decoupled by means of a third capacitor, connected to the base of the second transistor via a second input resistor.

It is to be noted that the output stage may operate in the saturated mode and thus produce dipped output signals in response in sinusoidal input signals, as a result of which it can perform a shaping function which renders the amplifier in accordance with the invention very suitable for use as an input amplifier for a prescaler which receives the output signals from the local oscillator of a television receiver. These output signals have a level which may vary between some millivolts and some hundreds of millivolts.

Finally, in accordance with a second embodiment, the invention relates to a high-frequency amplifier comprising a plurality of cascaded differential amplifier stages, which is characterized in that said stages comprise an input stage in accordance with the invention coupled to an emitter-coupled stage comprising a seventh transistor and an eighth transistor whose bases receive the output signals of the input stage. The input stage and the emitter-coupled stage are coupled by a first base resistor and a second base resistor which are arranged in series in the base circuit of the seventh transistor and the eighth transistor respectively, and whose resistance values lie between 1 and 2 times and preferably substantially 1.2 times the value of the intrinsic base resistance of said seventh transistor and eighth transistor so as to prevent the emitter-coupled stage from oscillating.

BRIEF DESCRIPTION OF THE DRAWINGS

Embodiments of the invention will now be described in more detail, by way of example, with reference to the accompanying drawings, in which.

DESCRIPTION OF THE PREFERRED EMBODIMENTS

Figure 1:
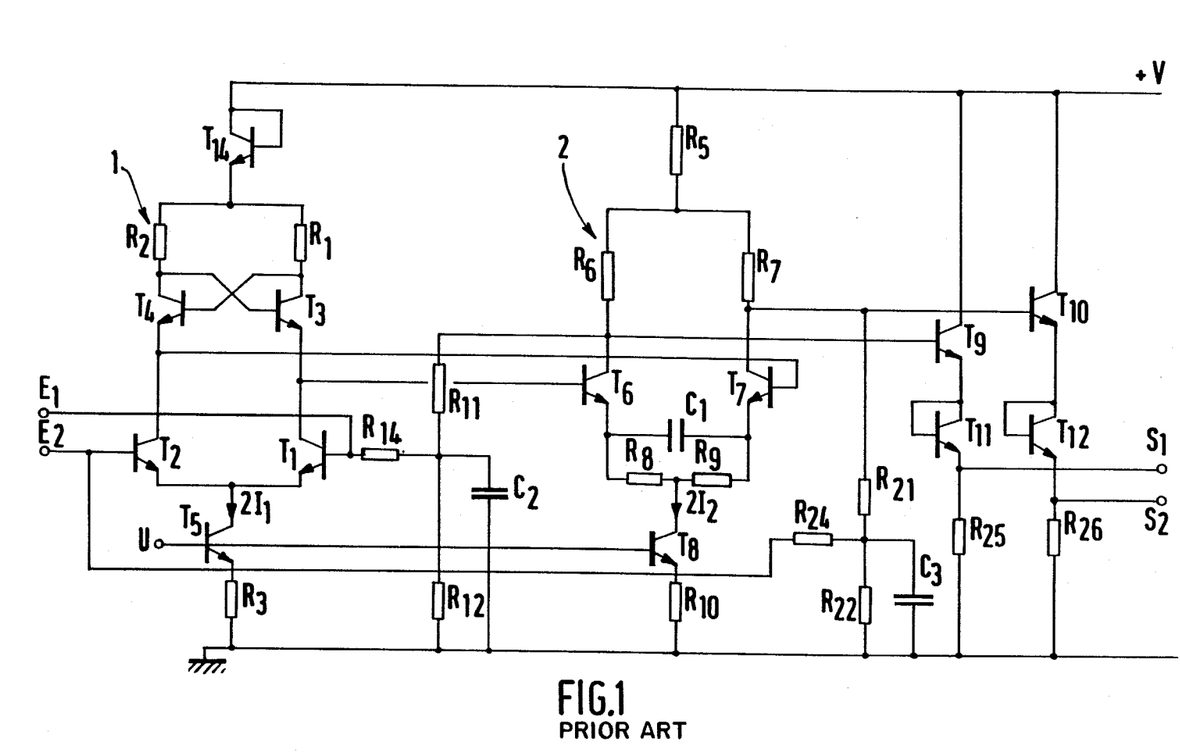
FIG. 1 is a circuit diagram of the amplifier in accordance with the aforementioned Patent Application.

The input stage of the amplifier in FIG. 1 comprises a differential stage with two transistors $T_1$ and $T_2$ whose emitters are coupled together and are connected to a current source comprising a transistor $T_5$ whose emitter is connected to ground via a resistor $R_3$. The base of the transistor $T_5$ receives a control voltage U which determines the current $2I_1$ supplied by the current source.

The inputs $E_1$ and $E_2$ of the amplifier are formed by the bases of the transistors $T_1$ and $T_2$ respectively. Two transistors $T_3$ and $T_4$ constitutes the resonant circuit of the input stage and have their emitters connected to the collectors of the transistors $T_1$ and $T_2$ respectively. The base of the transistor $T_3$ is connected to the collector of the transistor $T_4$ and vice versa. The collectors of the transistors $T_3$ and $T_4$ are connected to a supply voltage source via bias resistors $R_1$ and $R_2$ respectively of the same value. This voltage source is represented as a power supply $+V$ whose potential is reduced by one emitter-base voltage (approximately 0.8 V) by means of a diode-connected transistors $T_{14}$ which, for this purpose, has its collector and base connected to the power supply $+V$ and its emitter to the junction point of the resistors $R_1$ and $R_2$.

The output stage comprises a differential amplifier stage with two transistors $T_6$ and $T_7$ whose emitters are interconnected by a capacitor $C_1$ in parallel with a resistive bridge ($R_8$, $R_9$) whose tapping point is connected to a current source comprising a transistor $T_8$ whose emitter is connected to growth by a resistor $R_{10}$. The base of the transistor $T_8$ receives the control voltage U which determines the current $2I_2$ supplied by the current source. The resistors $R_8$ and $R_9$ and the capacitor $C_1$ constitute a phase-lead circuit which enables the gain of the output stage in the upper part of the operating-frequency range to be improved.

The output signals of the input stage are applied from the collectors of the transistors $T_1$ and $T_2$ to the bases of the transistors $T_6$ and $T_7$ respectively. The collectors of the transistors $T_6$ and $T_7$ are connected to a supply voltage source via resistors $R_6$ and $R_7$ respectively. This voltage source comprises a power supply V whose voltage is reduced by means of a resistor $R_5$ arranged in series between the power supply V and the junction point between the resistors $R_6$ and $R_7$, and in which therefore the current $2I_2$ always flows.

The outputs of the output stage are formed by the collectors of the transistors $T_6$ and $T_7$ and may be used directly. The transistors $T_9$ and $T_{10}$ are shown in emitter-follower arrangements, their collectors being connected to the power supply V, their bases to the collectors of the transistors $T_6$ and $T_7$ respectively, and their emitters to diode-connected transistors $T_{11}$ and $T_{12}$ poled in the forward direction, which results in a total shift by two base-emitter voltages (approximately 1.6 V). For this purpose, the collectors of the transistors $T_{11}$ and $T_{12}$ are short-circuited to their bases and are connected to the emitters of the transistors $T_9$ and $T_{10}$ respectively. The emitters of the transistors $T_{11}$ and $T_{12}$, which are connected to ground via resistors $R_{25}$ and $R_{26}$ respectively, constitute the outputs $S_1$ and $S_2$ of the amplifier.

Figure 2:
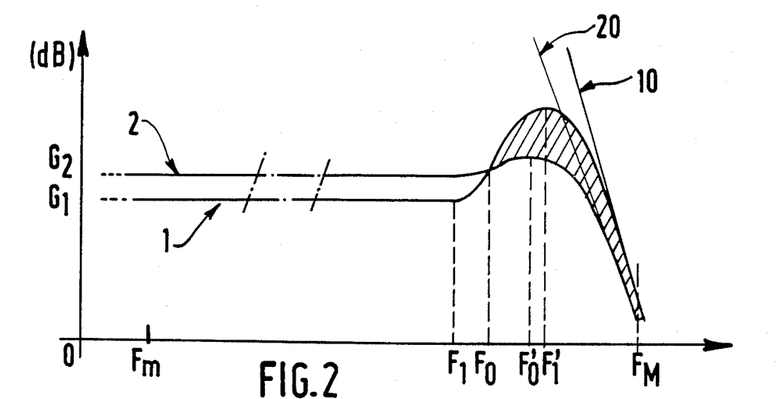
FIG. 2 shows the response curves of each of the two stages of said amplifier in the operating-frequency band of the amplifier.

FIG. 2 shows the response curves of the input stage where coupled to the output stage and of the output stage in the operating-frequency band of the amplifer, between a minimum frequency $F_m$ and a maximum frequency $F_M$.

The response curve of the input stage 1 when coupled to the output stage exhibits a substantially constant gain $G_1$ in the lower part of the frequency range of the amplifier. Under the influence of the resonant circuit, the gain increases distinctly from a frequency $F_1$ up to an anti-resonant frequency $F'_1$ corresponding to a maximum gain above which the gain again decreases to approximate an asymptote 10 with a slope of $-12$ dB/octave, the gain remaining higher than or equal to unity (0 dB) at the maximum frequency $F_M$.

In the lower part of the frequency range of the amplifier the response curve of the output stage 2 exhibits a substantially constant gain $G_2$ which may be close to $G_1$. Under the influence of the phase-lead circuit the gain becomes slightly higher starting from a frequency $F_0$ up to a frequency $F'_0$ above which the gain again decreases to approximate an asymptote 20 with a slope of $-6$ dB/octave, the gain remaining higher than or equal to unit (0 dB) at the selected maximum frequency $F_M$.

In the lower part of the operating frequency range of the amplifier, the two stages have substantially equal gain factors ($G_1 \simeq G_2$) up to a frequency $F_1$, above which the input stage has a higher gain as a result of the presence of said resonant circuit (hatched are). As the asymptote 10 of the curve 1 has a stronger slope than the asymptote 20 of the curve 2 there is a cross-over frequency which may be lower or, preferably, higher than $F_M$.

Hereinafter it will be explained how the circuit parameters are suitably selected in order to obtain the above response curves. This is illustrated by means of an example where Fm=40 MHz and $F_M$=1 GHz, which corresponds to an input amplifier intended for a frequency divider which can be used in a television receiver operating in this frequency band.

According to the Applicant the response curve $G_1(s)$ of the input stage alone, i.e. when not coupled to the output stage, may be represented in a first approximation by the following formula:

$$G_1(s) = \frac{G_1(1 - sT_1)}{(1 + sT_2)(1 + sT_3)}$$

where $$G_1 = \frac{R_1 I_1}{V_T}$$

$$T_1 = C_{BC}[4R_1 + R_b(1 + G_1)] = \frac{1}{2\pi F_1}$$

$$T_2 = C_{BC}(R_b + 4R_1) = \frac{1}{2\pi F_2}$$

$$T_3 = K C_{BE} \frac{V_T}{I_1} = \frac{1}{2\pi F_3}$$

where $K \simeq 4$ and $V_T = 26$ mV.

$C_{BC}$ and $C_{BE}$ are the base-collector and the base-emitter capacitances of the transistors $T_3$ and $T_4$ respectively.

The relationship $T_1 > T_2$ is always valid. The relationship $T_2 > T_3$ is also always valid because $C_{BE} \simeq 2C_{BC}$ for the integrated-circuit transistors used and the term $V_T/I_1$ is small ($I_1 \simeq 1$ mA) relative to $R_b + 4R_1$, so that:

$$F_1 < F_2 < F_3.$$

The curve 1 in FIG. 2 is therefore characteristic of the circuit arrangement of the input stage.

For more information about the design of transistors for use at very high frequencies, reference may be made to the publication by P. R. GRAY and R. G. MEYER "Analysis and Design of Analog Integrated Circuits" (published by John Wiley and sons USA-1977).

In the case of a transistor having an intrinsic cut-off frequency $f_T$ of the order of 5 GHz, when $R_1 = 100$ Ω and $I_1 = 1$ mA and consequently $G_1 \simeq 4$, this yields the following values:

$$F_1 \simeq 300 \text{ NHz}, F_2 \simeq 540 \text{ MHz}, F_3 \simeq 900 \text{ MHz}.$$

It is to be noted that the choice of high value for $G_1$ results in the value $F_3$ being reduced. Optimum results are obtained by adjusting the various parameters so as to ensure that $F_M$ is as high as possible (once the two stages are coupled).

The input stage may be used separately, but in the situation described here it is coupled to an output stage. The value of $T_1$, $T_2$ and $T_3$ are then modified slightly and the curve G(s) tends to approximate to an asymptote having a slope of $-12$ dB/octave for frequencies higher than $F_3$. In the above example the frequency $F_M$ for which the input stage has unity gain is distinctly higher than 1 GHz.

In the central and the lower part of the operating-frequency range the feedback of the transistors $T_3$ and $T_4$ has no effect and the gain has the value $G_1$, which can be calculated in the same way as for a conventional differential stage.

$$G_1 = \frac{R_1 I_1}{V_T}$$

Figure 4:
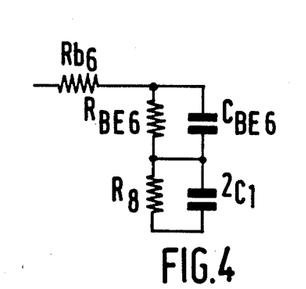
FIG. 4 is an equivalent diagram for the input impedance of the output stage.

The impedance of the second stage as seen from the output of the first stage is shown schematically in FIG. 4. It comprises the intrinsic base resistance $R_{b6}$ of the transistor $T_6$ in series with a part of the base-emitter resistance $R_{BE6}$ of $T_6$ and the resistor $R_8$, the base-emitter capacitance $C_{BE6}$ of $T_6$ across $R_{BE6}$ and a capacitor of the value $2C_1$ across $R_8$.

The response curve $G'(s)$ of the second stage may be expressed by the formula:

$$G'(s) = \frac{G_2(1 + sT_o)}{(1 + sT_4)(1 + sT_5)}$$

where $T_o = 2 R_8 C_1$ so that $$F_o = \frac{1}{4\pi R_8 C_1}$$

and with $R_6 = R_7$ $$G_2 = \frac{R_6 I_c}{V_T + R_8 I_2} \simeq \frac{R_6}{R_8}$$

For example, when $C_1 = 2.5$ pF, $R_6 = 360$ Ω and $R_8 = 80$ Ω this results in $G_2 = 4.5$ and $F'_o \simeq 400$ MHz.

However, it is to be noted that the amplifier can be optimised only when the two stages are adjusted when they are coupled to each other, the output stage in its turn being preferably connected to the circuit to be driven. Indeed, as stated in the foregoing, the input impedance of this output stage considerably influences the high-frequency characteristics of the input stage.

A good approach to the overall adjustment of the amplifier is to determine first of all the parameters of the input stage alone, as indicated above, to select the desired gain $G_2$ of the output stage by determining a ratio $$\frac{R_7}{R_9} = \frac{R_6}{R_8},$$

to select the frequency $F_o$ near the frequency $F_1$ of the input stage, and to vary the values of $R_8 = R_9$ and of $C_1$, while maintaining the ratio $$\frac{R_7}{R_8} = \frac{R_6}{R_9}$$

and the product $R_8 C_1$ constant until a maximum frequency is obtained which corresponds to unity gain (0 dB), which means that the two stages are correctly matched to one another.

In a suitable embodiment the amplifier comprises a circuit which introduces coupling between its output and its input in order to limit the d.c. gain.

Figure 3:
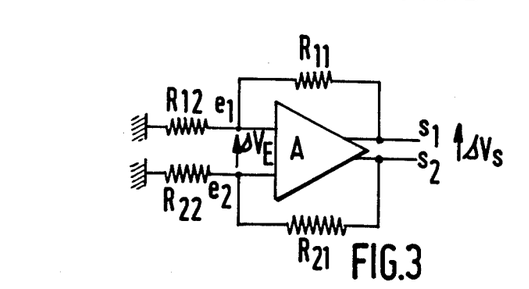
FIG. 3 is an equivalent diagram for the loop which limits the gain for the d.c. component of the signal.
Figure 5:
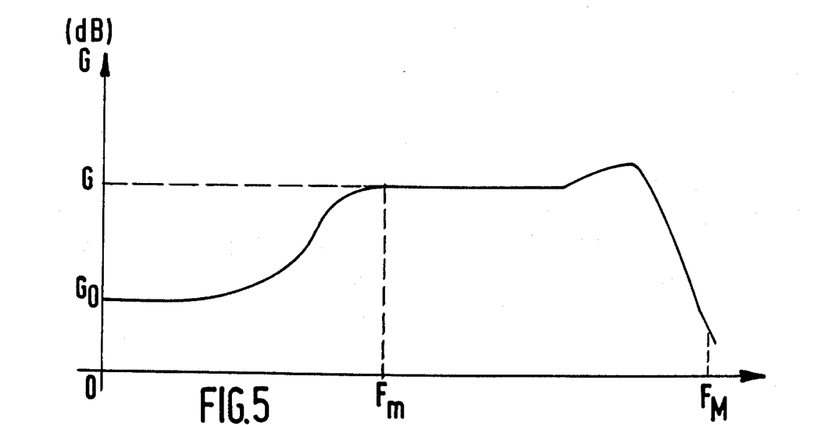
FIG. 5 shows the response curve of said amplifier.

To this end the collector of the transistor $T_6$ is connected to ground via a first divider bridge comprising two resistors $R_{11}$ and $R_{12}$, a capacitor $C_2$ being connected across the resistor $R_{12}$, between the tapping point of the divider bridge and ground. The centre point of the divider bridge is connected to the base of the transistor $T_1$ via an input resistor $R_{14}$. Similarly, the collector of the transistor $T_7$ is connected to ground via a second divider bridge comprising two resistors $R_{21}$ and $R_{22}$, a capacitor $C_3$ being connected across the resistor $R_{22}$, between the tapping point of the second divider bridge and ground. The tapping point of the second divider bridge is connected to the base of the transistor $T_2$ by an input resistor $R_{24}$. $R_{12}$, $R_{22}$, $C_2$ and $C_3$ are selected in such a way that in the operating-frequency band of the amplifier $C_2=C_3$ constitute a short-circuit, which at these frequencies has the same effect as arranging $R_{14}$ and $R_{24}$ between the base of $T_3$ and $T_4$ respectively and ground. Consequently, $R_{14}$ and $R_{24}$ determine the input impedance of the input stage. For example, $R_{14}=R_{24}=500\ \Omega$. Below a frequency $$F_m = \frac{1}{2\pi R_{12} C_2} = \frac{1}{2\pi R_{22} C_3}$$

the gain of the amplifier decreases to a value $G_o$ (see FIG. 5) equeal to $$1 + \frac{R_{11}}{R_{12}} = 1 + \frac{R_{21}}{R_{22}},$$

which is the value of the gain obtained for the d.c. component of the signal. For a gain lower than 2 it is necessary that $R_{11} < R_{12}$. Indeed, for direct current the capacitors $C_2$ and $C_3$ are charged via the resistors $R_{14}$ and $R_{24}$ respectively. Both terminals of $R_{14}$ are at a potential $e_1$ and those of $R_{24}$ at a potential $e_2$. As a result of this, the equivalent diagram is as shown in FIG. 3, which represents an amplifier A having two inputs $e_1$ and $e_2$ and two outputs $s_1$ and $s_2$, the resistor $R_{12}$ being arranged between $e_1$ and ground, the resistor $R_{22}$ between $e_2$ and ground, the resistor $R_{11}$ between $s_1$ and $e_1$, and the resistor $R_{21}$ between $s_2$ and $e_2$.

The value of the above-mentioned gain follows from the requirement that the currents in each of the branches should be balanced.

For example, for $R_{11}=R_{21}=5.2$ k$\Omega$, $R_{12}=R_{22}=7.4$ k$\Omega$, $C_2=C_3=1$ pF, this yields $F_m\approx 42$ MHz and $G_o=1.73$ for an overall gain $G=G_1.G_2\approx 18$ of the amplifier when the same values as in the above examples are used.

A signal-shaping function can be obtained by means of the output stage by clipping of sinusoidal signals (operation in the saturated mode). For this purpose, the supply voltage of the output stage should be selected, for example, by choosing the value of the resistor $R_5$ in such a way that, if the gain G is obtained, clipping is effected for input signals $E_1$, $E_2$ of the lowest level anticipated under normal operating conditions of the amplifier.

Figure 6:
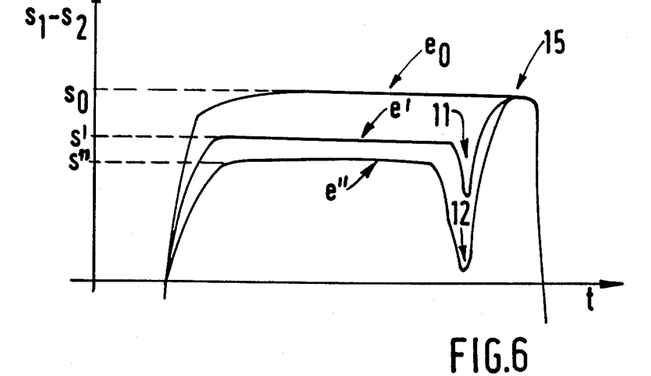
FIG. 6 shows the waveforms of the signals at the output of the first stage of said amplifier for a positive half-cycle in the saturated mode for input signals of different values.

As is shown in FIG. 6, when the level ($E_1-E_2$) of the sinusoidal input signals reaches the value $e_o$ (for example 70 mV), the output signal ($s_1-s_2$) of the input stage reaches but does not exceed the nominal saturation level $s_o$ of the stage.

This means that $s_o=2I_1 R_1$.

For input signals having a level $e'>e$, (for example $e'=100$ mV) there is a saturation plateau of a level $s'<s_o$ and there is also a dip into output level at 11 before the curve returns to the saturation level $s_o$ at 15.

For input signals of a level $e''>e'$ (for example, $e''=150$ mV), the level of the saturation plateau is $s''<s'$ and the dip in the level (at 12) is even more pronounced and may even reach the 0 V level, thus causing spurious signal transients which are very annoying for use in frequency dividers.

This effect occurs only in a part of the passband of the input stage, namely at frequencies below but close to the resonant frequency of the resonant circuit ($R_1$, $R_2$, $T_3$, $T_4$).

It is to be noted that the effects occurring at very high frequencies are very complex and cannot be explained by means of approximations. According to the Applicant these effects may be interpreted as follows. At frequencies below its resonant frequency the resonant circuit in principles behaves as an inductance. For weak signals the transistors $T_3$ and $T_4$ are not switched completely and the behaviour of the load remains linear. However, when the amplifier operates in the saturated mode, the resonant circuit behaves as a flip-flop. Charges are then temporarily stored in the collector-base capacitance of the transistors $T_1$ and $T_2$ and the base-emitter capacitance of the transistors $T_3$ and $T_4$. The saturation plateau (having a level s' or s" in FIG. 6) is caused by the discharge of the base-emitter capacitance of the transistor $T_3$ or the transistor $T_4$ depending on the half-cycle of the sinusoidal input signal. The dip in level (at 11 or at 12 in FIG. 6) is in itself caused by discharging of the collector-base capacitance of the transistor $T_1$ or the transistor $T_2$ depending on the half-cycle of the sinusoidal input signal.

This charge-storage effect in the collector-base capacitance of the transistors $T_1$ and $T_2$ and tne emitter-base capacitance of the transistors $T_3$ and $T_4$ can be mitigated by ensuring that the transistors $T_3$ and $T_4$ are not driven into full conduction by impressing an emitter current upon them.

Figure 7:
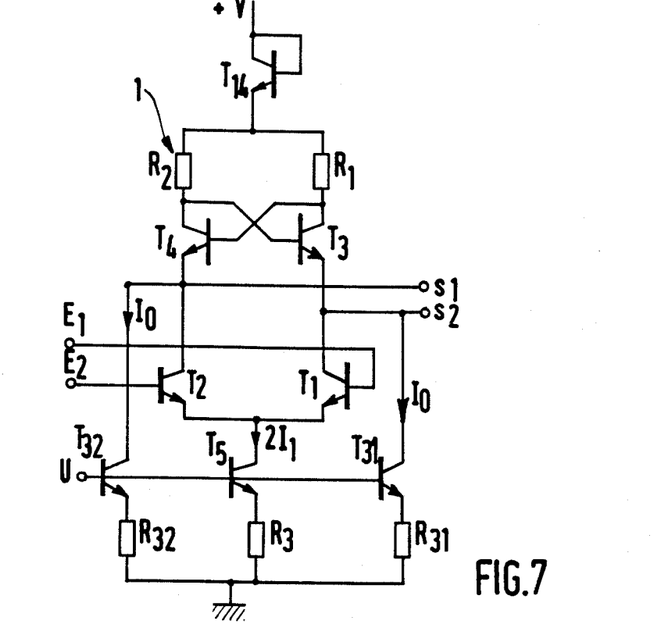
FIG. 7 shows the first stage of said amplifier, modified in accordance with the invention.

This can be achieved by means of the circuit shown in FIG. 7. In this circuit, the input stage comprises the same elements $R_1$, $R_2$, $R_3$, $T_1$, $T_2$, $T_3$, $T_4$, $T_5$ and $T_{14}$ as in FIG. 1. The outputs $s_1$ and $s_2$ formed by the collectors of the transistors $T_2$ and $T_1$ respectively are connected to the bases of the transistors $T_7$ and $T_6$ respectively.

Moreover, in accordance with the invention, the circuit of FIG. 7 comprises two current sources, suitably supplying the same current $I_o$. To this end a transistor $T_{31}$, whose base receives the voltage U, has its collector connected to the output $s_2$, which is the junction point between the collector of the transistor $T_1$ and the emitter of the transistor $T_3$, and has a resistor $R_{31}$ arranged between its emitter and ground. A transistor $T_{32}$, whose base receives the voltage U, has its collector connected to the output $s_1$, which is the junction point between the collector of the transistor $T_2$ and the emitter of the transistor $T_4$, and has a resistor $R_{32}$, preferably having the ame resistance value as $R_{31}$, arranged between its emitter and ground.

The current $I_o$ may be very small, but it will be appreciated that in this case a really significant result can be obtained only if this current is at least equal to the dynamic base current of the transistors $T_6$ and $T_7$ of the second stage.

This dynamic base current has the value $I_2/\beta$, $\beta$ being the current gain (approximately 50) of the transistors $T_6$ and $T_7$. For example, for $I_2=1.5$ mA, this means that $I_o \geq 30\ \mu$A.

It is evident that the compensation for the charge-storage effects becomes more effective as the value of $I_o$ increases. It is to be noted also that for the operation of the stage in the normal saturated mode the currents $I_o$ supplied by the two current sources contribute to the current $2I_1$ for the operation of the transistors $T_3$ and $T_4$. It follows that the saturation level $s_o$ is raised and has a value $$s_{10}=2(I_1+I_o)R1$$

The optimum value of $I_o$ is estimated to be 0.2 $I_1$. For $I_1=1$ mA and $I_o=0.2$ mA this yields $s_o=200$ mV and $s_{10}=240$ mV.

Suitably, care is taken that $I_o < I_1$ in order to prevent the stage from oscillating due to an excessive current $I_o$ being switched. The high frequency differential amplifier stage in accordance with the invention may be used as such or as an input stage for an amplifier comprising a plurality of cascaded differential amplifier stages.

Such an amplifier can be realised with a direct coupling between the output of the stage in accordance with the invention and the input of a subsequent stage, which is also of the differential amplifier type. The subsequent stage may be of the logic type, for example a bistable multivibrator circuit, or a linear circuit, for example the output stage shown in FIG. 1. In either case, and as indicated above, $I_o$ is suitably selected to be at least equal to the dynamic input current of the subsequent stage, i.e. in the present case the dynamic base current of the transistors of the subsequent stage, and smaller than $I_1$.

An additional requirement is that the subsequent stage snould not oscillator. For this purpose the relationship $R_1 I_0 = R_1 I_0 < \Delta V$ must be satisfied, $\Delta V$ being the linear range at the input of the subsequent stage (see FIG. 9).

When the subsequent stage is the output stage of FIG. 1, this means that:

$$\Delta V = 2V_t + R_8 I_2$$

where $V_t = 26$ mV. If, more in particular, the situation is considered where the amplifier is used as an input amplifier for a prescaler in a television receiver, the output stage, which is of the phase-lead type, is also used, as stated above, for the purpose of signal shaping by clipping.

For weak or average signals the input stage operates in the linear mode and clipping is effected by the output stage only, which is to be preferred. For signals of a high level, the input stage clips the signals. The rise in clipping level $s_o$ under the influence of the current $I_o$ is advantageous because it enables the input stage to handle higher levels without clipping.

Figure 8:
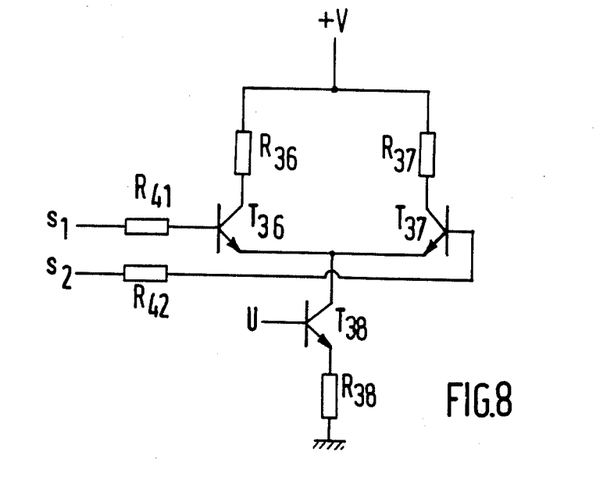
FIG. 8 shows an amplifier stage for use in combination with the amplifier stage in accordance with the invention.
Figure 9:
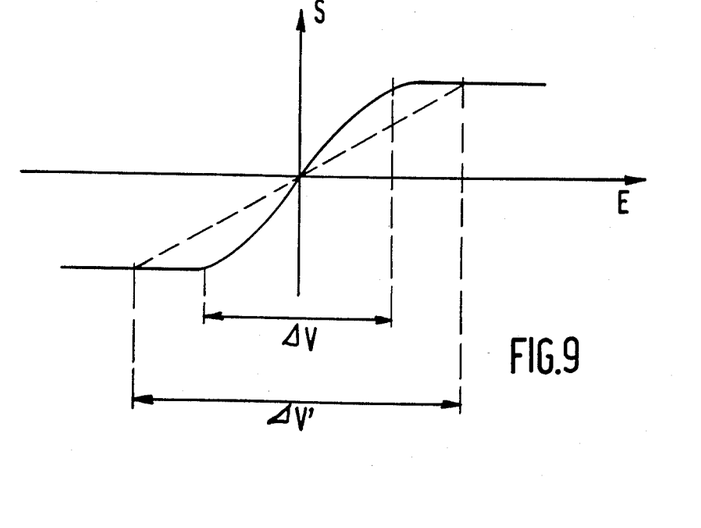
FIG. 9 shows the response curve of the amplifier stage of FIG. 8.

In FIG. 8 the stage in accordance with the invention described above can drive a differential amplifier stage comprising two transistors whose emitters are coupled directly. The collectors of these transistors may be connected to a power supply $+V$ by resistors $R_{36}$ and $R_{37}$. The coupled emitters of the transistors $T_{36}$ and $T_{37}$ are connected to a current source and for this purpose they are connected to the collector of a transistor $T_{38}$ whose base receives the voltage U and whose emitter is connected to ground via a resistor $R_{38}$. In this arrangement, the stage can be prevented from oscillating by arranging coupling resistors $R_{41}$ and $R_{42}$ in series between the collectors of the transistors $T_2$ and $T_1$ and the bases of the transistors $T_{36}$ and $T_{37}$ respectively. These coupling resistors, which are preferably of the same value, have a resistance higher than the intrinsic base resistance of the transistors $T_{36}$ and $T_{37}$ but smaller than twice this value and suitably substantially equal to 1.2 times this value. The function of the resistors $R_{41}$ and $R_{42}$ is illustrated in FIG. 9.

Under static conditions are differential amplifier stage has a linear input range $\Delta V$. The resistors $R_{41}$ and $R_{42}$ enable this linear range to be extended to $\Delta V'$ under dynamic conditions, as is indicated in broken lines.

A really significant extension of this linear range can be obtained only if $R_{41}$ and $R_{42}$ have values higher than the intrinsic base resistance of the transistors $T_{36}$ and $T_{37}$. However, if the values of the resistors $R_{41}$ and $R_{412}$ become too high and exceed twice the intrinsic base resistance, the speed of the stage shown in FIG. 8 will be reduced substantially.

What is claimed is:

1. A high-frequency differential amplifier stage comprising, a first transistor and a second transistor having emitters coupled to each other and connected to a first current source, each transistor having a base and a collector with the bases connected to input terminals for receiving input signals and the collectors connected to emitters of a third and a fourth transistor, respectively, said third and fourth transistors having their collectors connected to a supply-voltage terminal via a first and a second load resistor, respectively, bases of the third transistor and the fourth transistor being connected to collectors of the fourth and third transistor, respectively, a second current source connected to a junction point between the collector of the second transistor and the emitter of the fourth transistor, and a third current source connected to a junction point between the collector of the first transistor and the emitter of the third transistor, currents of the second current source and the third current source and the third transistor, respectively, the sum of the currents of the second and third current sources being smaller than the current of the first current source.

2. An amplifier stage as claimed in claim 1, wherein the ratio between the sum of the currents of the second current source and the third current source and the current of the first current source is substantially equal to 0.2.

3. A high-frequency amplifier comprising a plurality of direct-coupled cascaded differential amplifier stages, characterized in that said stages comprise an input stage as claimed in claim 1 coupled directly to a subsequent stage, and in that the product of the current from the second current or the third current source and the resistance of the first load resistor or the second load resistor is smaller than the linear input range ($\Delta V$) of the subsequent stage.

4. An amplifier as claimed in claim 3, characterized in that the subsequent differential stage is an output stage comprising a fifth transistor and a sixth transistor whose bases are connected to the collectors of the first transistor and the second transistor respectively, whose collectors are connected to the supply voltage terminal by a third load resistor and a fourth load resistor, respectively, and whose emitters are interconnected by a first capacitor coupled in parallel with a first resistive divider whose tapping point is connected to a fourth current source, and in that the elements of the first resistive divider, the first capacitor and the load resistors are selected such that tne amplifier has an overall gain greater than unity in its operating frequency range.

5. An amplifier as claimed in claim 4, characterized in that the selection also provides the amplifier with a gain higher than a given nominal value at its minimum operating frequency.

6. An amplifier as claimed in claim 4 or 5, characterized in that the collectors of the fifth transistors and the sixth transistor are connected to bases of first and second output transistors each arranged as an emitter-follower.

7. An amplifier as claimed in claim 6 including means for limiting amplifier gain for d.c. components of the input signals, said limiting means comprising, a second resistive divider coupled between the collector of the fifth transistor and ground and having a first tap point connected to the base of the first transistor via a first input resistor, a third resistive divider coupled between the collector of the sixth transistor and ground and having a second tap point connected to the base of the second transistor via a second input resistor, and second and third capacitors coupled to said first and second tap points, respectively, so as to decouple the respective first and second tap points.

8. An amplifier as claimed in claims 4 or 5, characterized in that, in order to limit the gain for d.c. components of the input signals, the amplifier comprises a second resistive divider coupled between the collector of the fifth transistor and ground and whose tapping point, which is decoupled by means of a second capacitor, is connected to the base of the first transistor via a first input resistor, and a third resistive divider coupled between the collector of the sixth transistor and ground and whose tapping point, which is decoupled by means of a third capacitor, is connected to the base of the second transistor via a second input resistor.

9. An amplifier as claimed in claim 4 or 5, characterized in that its gain for input signals of a level higher than a nominal minimum level cause the output stage operate in the saturated mode in such that, in response to sinusoidal input signals, clipped output signals are produced.

10. A high-frequency amplifier comprising a plurality of cascaded differential amplifier stages, characterized in that said stages comprise an input stage as claimed in claim 1 coupled to an emitter-coupled differential amplifier stage comprising a fifth transistor and a sixth transistor whose bases receive the output signals of the input stage, and in that the input stage and the emiter-coupled differential amplifier stage are coupled by a first base resistor and a second base resistor connected in series in the base circuit of the fifth transistor and the sixth transistor, respectively, and whose resistance values lie between 1 and 2 times the intrinsic base resistance of said fith and sixth transistor.

11. A high-frequency amplifier as claimed in claim 10, characterized in that the value of one of said base resistors is substantially equal to 1.2 times said intrinsic base resistance.

12. An amplifier stage as claimed in claim 1 further comprising a diode element coupling said first and second load resistors to the supply-voltage terminal, and wherein said third and fourth transistors are coupled together to form a resonant circuit.

* * * * *